(12) United States Patent
Park et al.

(10) Patent No.: US 8,211,725 B2
(45) Date of Patent: Jul. 3, 2012

(54) METHOD OF MANUFACTURING FLEXIBLE DISPLAY DEVICE

(75) Inventors: Yong-Hwan Park, Yongin (KR); Jae-Seob Lee, Yongin (KR); Moo-Jin Kim, Yongin (KR); Young-Shin Pyo, Yongin (KR); Sang-Joon Seo, Yongin (KR); Hoon-Kee Min, Yongin (KR); Dong-Un Jin, Yongin (KR)

(73) Assignee: Samsung Mobile Display Co., Ltd. (KR)

( * ) Notice: Subject to any disclaimer, the term of this patent is extended or adjusted under 35 U.S.C. 154(b) by 0 days.

(21) Appl. No.: 13/040,906

(22) Filed: Mar. 4, 2011

(65) Prior Publication Data

US 2011/0223697 A1 Sep. 15, 2011

(30) Foreign Application Priority Data

Mar. 9, 2010 (KR) ........................ 10-2010-0021017

(51) Int. Cl.
*H01L 21/00* (2006.01)
(52) U.S. Cl. ............. 438/34; 438/33; 438/149; 438/460
(58) Field of Classification Search ................ 438/29, 438/30, 33, 34, 73, 149–166, 460, 464
See application file for complete search history.

(56) References Cited

U.S. PATENT DOCUMENTS

| 2005/0168141 | A1* | 8/2005 | Henseler et al. ............. 313/506 |
| 2007/0091232 | A1 | 4/2007 | Kim et al. |
| 2007/0105252 | A1 | 5/2007 | Lee et al. |
| 2008/0176477 | A1 | 7/2008 | Hwang et al. |
| 2009/0266471 | A1 | 10/2009 | Kim et al. |
| 2010/0264112 | A1* | 10/2010 | Jiang et al. ...................... 216/34 |
| 2010/0283056 | A1* | 11/2010 | Yasumatsu ...................... 438/34 |

FOREIGN PATENT DOCUMENTS

| JP | 2008-268666 | 11/2008 |
| JP | 2008268666 | 11/2008 |
| KR | 2007-0043487 | 4/2007 |
| KR | 1020070047114 | 4/2007 |
| KR | 2008-0068348 | 7/2008 |
| KR | 2008-0073942 | 8/2008 |
| KR | 1020080103480 | 11/2008 |
| KR | 1020090114195 | 3/2009 |
| KR | 2009-0069680 | 7/2009 |
| WO | WO 2009110042 A1 * | 9/2009 |

* cited by examiner

*Primary Examiner* — Charles Garber
*Assistant Examiner* — Bryan Junge
(74) *Attorney, Agent, or Firm* — Knobbe Martens Olson & Bear LLP

(57) ABSTRACT

A method of manufacturing a flexible display device is disclosed. The method includes arranging a first substrate having a plurality of depression units, forming a first plastic film in each of the plurality of depression units, forming a thin film transistor (TFT) on the first plastic film, forming a display device on the TFT, where the display device is configured to be electrically connected to the TFT, encapsulating an upper portion of the display device, cutting the first substrate, and separating the first substrate from the first plastic film.

20 Claims, 8 Drawing Sheets

METHOD OF MANUFACTURING FLEXIBLE DISPLAY DEVICE

CROSS-REFERENCE TO RELATED APPLICATIONS

This application claims the benefit of Korean Patent Application No. 10-2010-0021017, filed on Mar. 9, 2010, in the Korean Intellectual Property Office, the disclosure of which is incorporated herein in its entirety by reference.

BACKGROUND

1. Field

One or more embodiments of the present invention relate to a method of manufacturing a flexible display device, and more particularly, to a method of manufacturing a flexible display device, whereby a display unit including a thin film transistor (TFT) is easily cut.

2. Description of the Related Technology

The market for liquid crystal display (LCD) devices including a thin film transistor (TFT), and for organic light emitting display devices has expanded toward displays for mobile devices including digital cameras, video cameras, Portable Digital Assistants (PDAs), and the like.

It is desirable for such displays to be thin, lightweight, and durable against breakage. In order to manufacture thin and lightweight displays, a thin glass substrate is typically used. A method has been introduced whereby a substrate is manufactured by using an existing glass substrate, and then the glass substrate is mechanically or chemically thinned. However, this method may present some problems, such as complicated procedures, and easy breakage of the glass substrate making it difficult to use.

It is also desirable for the mobile devices to be flexible to accommodate a curved surface, so as to become display devices having various shapes. However, it is generally difficult to implement flexibility when using an existing glass substrate.

In order to address some of these problems, there has been an attempt to form a low temperature polycrystalline silicon TFT on a plastic substrate. Plastic is not easily broken even when the plastic has a thickness of only about 0.2 mm, and weight of plastic is typically less than glass, so that weight of a plastic substrate may be equal to or less than a fifth of the weight of an existing glass substrate, making it possible to implement a curved surface by using the plastic substrate.

However, if the plastic substrate is made thin, when a TFT and a display device are sequentially formed on the plastic substrate, the plastic substrate may not be able to hold a load due to the plastic substrate's flexible characteristic, and thus it may be difficult to handle the plastic substrate.

In order to address this problem, research is being conducted to form a thin plastic substrate on a glass substrate, to form a display unit including a TFT and a display device on the thin plastic substrate, and then to separate the glass substrate from the plastic substrate. Generally, a plurality of the display units are formed on a substrate having a large area, and the plurality of the display units are then cut into units of panels. This necessitates cutting two substrates, the glass substrate and the plastic substrate, and such a substrate-cutting process is not generally easy.

SUMMARY OF CERTAIN INVENTIVE ASPECTS

One or more embodiments of the present invention include a method of manufacturing a flexible display device, whereby a cutting process is easily performed on a panel of a display unit.

Additional aspects will be set forth in part in the description which follows and, in part, will be apparent from the description, or may be learned by practice of the presented embodiments.

One aspect is a method of manufacturing a flexible display device, the method including: arranging a first substrate having a plurality of depression units, forming a first plastic film in each of the plurality of depression units, forming a thin film transistor (TFT) on the first plastic film, forming a display device on the TFT, where the display device is configured to be electrically connected to the TFT, encapsulating an upper portion of the display device, cutting the first substrate, and separating the first substrate from the first plastic film.

Another aspect is a method of manufacturing a flexible display device, the method including: arranging a first substrate having a plurality of depression units, forming a first plastic film in each of the plurality of depression units, forming a thin film transistor (TFT) on the first plastic film, forming a display device on the TFT, where the display device is configured to be electrically connected to the TFT, encapsulating an upper portion of the display device, irradiating a laser beam, separating the first plastic film, the TFT, and the display device from the first substrate in units of panels, where the TFT and the display device are formed on the plastic film.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION OF CERTAIN INVENTIVE EMBODIMENTS

Reference will now be made in detail to embodiments, examples of which are illustrated in the accompanying drawings. As used herein, the term "and/or" includes any and all combinations of one or more of the associated listed items.

Figure 1:
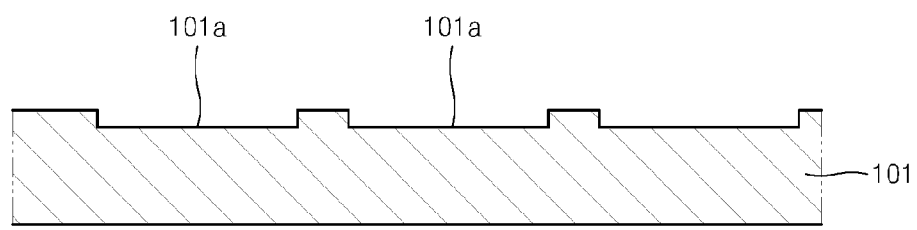
FIGS. 1 through 12 are cross-sectional views for schematically illustrating an embodiment of a process of manufacturing an embodiment of an organic light emitting display device as a flexible display device.

As illustrated in FIG. 1, a first substrate 101 having a plurality of depression units 101a is arranged.

When a display device is manufactured, a plurality of panels is simultaneously formed on one substrate. After an encapsulation process is complete, a cutting process is typically necessary to divide the panels before the substrate is separated from a plastic film. Since a polymer plastic film is coated on the substrate, if the substrate is cut by using only a diamond wheel used to cut a glass substrate according to the related art, the plastic film may be torn, or a thin film transistor (TFT) or a wire may be damaged. In order to address this problem, the plastic film is first cut by using a laser, and then the substrate is cut by using the diamond wheel. In order to carry out this procedure, laser equipment has to be additionally arranged, and the manufacturing costs may increase.

An embodiment of a method of manufacturing the flexible display device involves forming a depression unit 101a in each panel region of the first substrate 101 and forming a plastic film, a TFT, and display devices on the depression unit 101a so that the plastic film is not formed on a cutting region, and thus the plastic film is not cut.

In some embodiments, the first substrate 101 may be a light-transmitting substrate allowing a laser beam to pass through it when a separation process is performed. The first substrate 101 may be formed of a material having sufficient mechanical rigidity to avoid deformation even with various devices or layers formed on the first substrate 101. In one embodiment, glass may be used as the material for the substrate 101. In other embodiments, various other materials having such characteristics may be used as the first substrate 101.

Figure 2A:
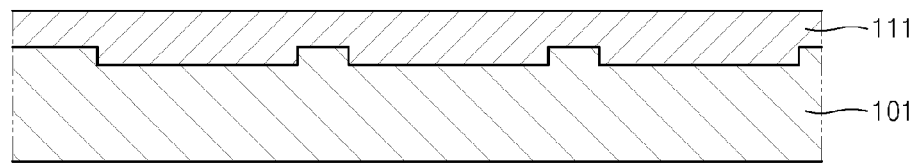
Figure 2B:
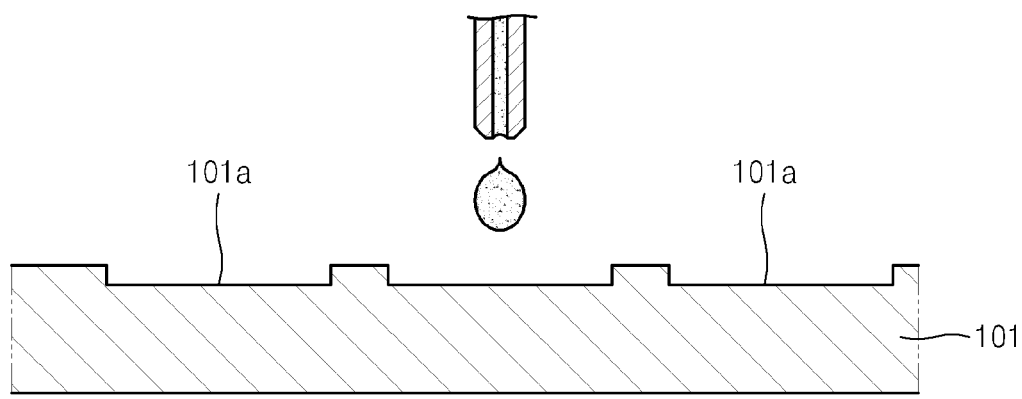

As illustrated in FIGS. 2A and 2B, a first plastic film 111 is formed in the plurality of depression units 101*a* of the first substrate 101. To form the first plastic film 111, two methods may be used.

In some embodiments, such as the one illustrated in FIG. 2A, the first plastic film 111 is entirely formed on the first substrate 101 by performing a spin coating operation, a slot die operation, or the like, and portions of the first plastic film 111 above a top surface of the first substrate 101 are etched so that the first plastic film 111 may be formed in the plurality of depression units 101*a* of the first substrate 101.

In other embodiments, such as the one illustrated in FIG. 2B, the first plastic film 111 may be formed in the plurality of depression units 101*a* of the first substrate 101 such that the first plastic film 111 is filled only in the plurality of depression units 101*a* of the first substrate 101 by using a drop technique such as nozzle printing, inkjet printing, or the like.

Figure 3:
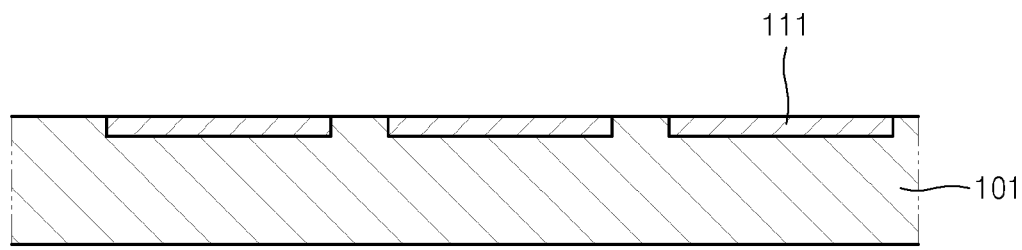

As illustrated in FIG. 3, the plurality of depression units 101*a* of the first substrate 101 is filled with the first plastic film 111.

In some embodiments, the first plastic film 111 may be formed of polyimide, polycarbonate, or the like. Polyimide generally has excellent mechanical hardness. The highest processing temperature for polyimide is about 450° C., such that polyimide has excellent heat resistance, compared to other polymer materials. With a heating process performed when a TFT and an organic light emitting diode (OLED) are formed on a polyimide substrate, the polyimide substrate may not sag due to the weight of devices and layers, and may stably function as the flexible display device.

Figure 4:
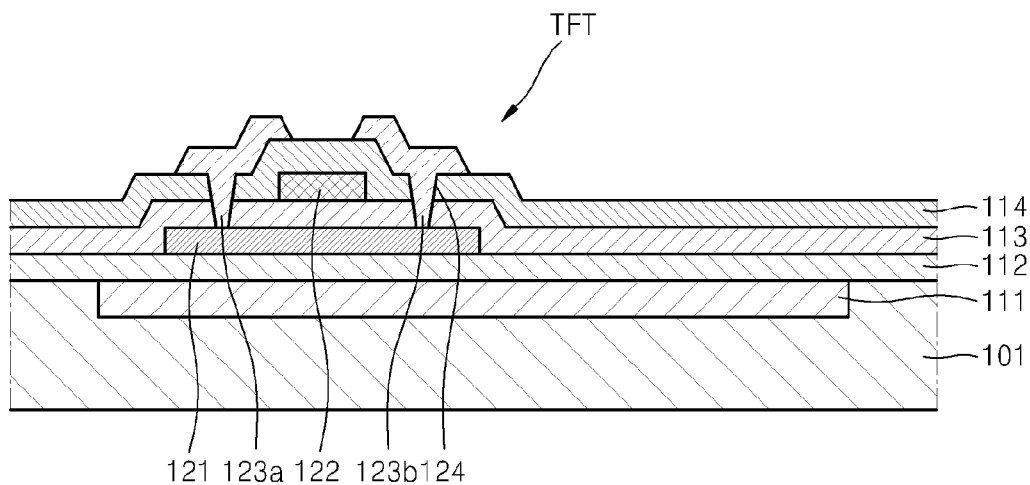

As illustrated in FIG. 4, a first barrier layer 112 is formed on the first plastic film 111 of the first substrate 101. A TFT is formed above the first barrier layer 112. FIG. 4 illustrates an embodiment of a top gate TFT. In other embodiments, a TFT having a different structure such as a bottom gate TFT may also be formed.

In some embodiments, the first barrier layer 112 may be formed of an inorganic material including silicon oxide (SiOx), silicon nitride (SiNx), silicon oxynitride (SiON), aluminium oxide (AlOx), aluminium oxynitride (AlON), or the like. In other embodiments, the first barrier later 112 may be formed of an organic material including acryl, polyimide, or the like. In some embodiments, the organic material and the inorganic material may be alternately stacked to form the first barrier layer 112. The first barrier layer 112 functions to block oxygen and moisture, and to help crystallization of a semiconductor by preventing the diffusion of moisture or impurities generated in the first plastic film 111, or by adjusting a heat transfer speed when the crystallization is performed.

In the embodiment of FIG. 4, a semiconductor layer 121, a gate insulating film 113, a gate electrode 122, an interlayer insulating film 114, a contact hole 124, source and drain electrodes 123*a* and 123*b*, and a protective film (115 in FIG. 5) are sequentially formed on the first barrier layer 112.

In some embodiments, the semiconductor layer 121 may be formed of polysilicon. In one embodiment, a region of the semiconductor layer 121 may be doped with impurities. In other embodiments, the semiconductor layer 121 may be formed of amorphous silicon, or of various organic semiconductor materials including pentacene or the like.

In embodiments where the semiconductor layer 121 is formed of polysilicon, amorphous silicon is formed, is crystallized, and is changed into polysilicon. The crystallization may be performed by using various crystallization methods including a rapid thermal annealing (RTA) method, a Solid Phase Crystallization (SPC) method, an Excimer Laser Annealing (ELA) method, Metal Induced Crystallization (MIC), a Metal Induced Lateral Crystallization (MILC) method, a Sequential Lateral Solidification (SLS) method, or the like. In order to use a plastic film, a crystallization method that does not use a high temperature heating procedure may be used. A low temperature poly-silicon (LTPS) process at a temperature greater than 300° C. may be used given improvements in heat resistance of plastic film. In one embodiment, the TFT may be formed by using the plastic film, by using a polyimide substrate.

In order to insulate the semiconductor layer 121 from the gate electrode 122, a gate insulating film 113 is formed therebetween. In some embodiments, the gate insulating film 113 may be formed of an insulating material including silicon oxide, silicon nitride or the like. In other embodiments, the gate insulating film 113 may be formed of an insulating organic material.

The gate electrode 122 may be formed of various conductive materials. In some embodiments, the gate electrode 122 may be formed of a material including magnesium (Mg), Al, nickel (Ni), chromium (Cr), molybdenum (Mo), tungsten (W), molybdenum-tungsten (MoW), gold (Au) or the like. In various embodiments, the gate electrode 122 may be formed as a single layer or as multiple layers.

In some embodiments, the interlayer insulating film 114 may be formed of an insulating material including silicon oxide, silicon nitride or the like. In other embodiments, the interlayer insulating film 114 may be formed of an insulating organic material. The interlayer insulating film 114 and the gate insulating film 113 may be selectively removed so as to form the contact hole 124 via which source and drain regions 123*a* and 123*b* are exposed. In order to fill the contact hole 124, the source and drain electrodes 123*a* and 123*b* are formed by using the material for forming the gate electrode 122.

The protective film (passivation layer and/or planarization layer) (115 in FIG. 5) is formed on the source and drain electrodes 123*a* and 123*b* to protect and planarize the TFT therebelow. In some embodiments, the protective film (115 in FIG. 5) may be formed of various materials including an organic material such as benzocyclobutene (BCB), acryl or the like. In other embodiments, the protective film (115 in FIG. 5) may be formed of an inorganic material such as SiNx or the like. The protective film (115 of FIG. 5) may be formed as a single layer, as a double layer, or as multiple layers.

A display device is formed on the TFT. In one embodiment, an OLED may be the display device. In other embodiments, one of various other types of display devices may be formed.

Figure 5:
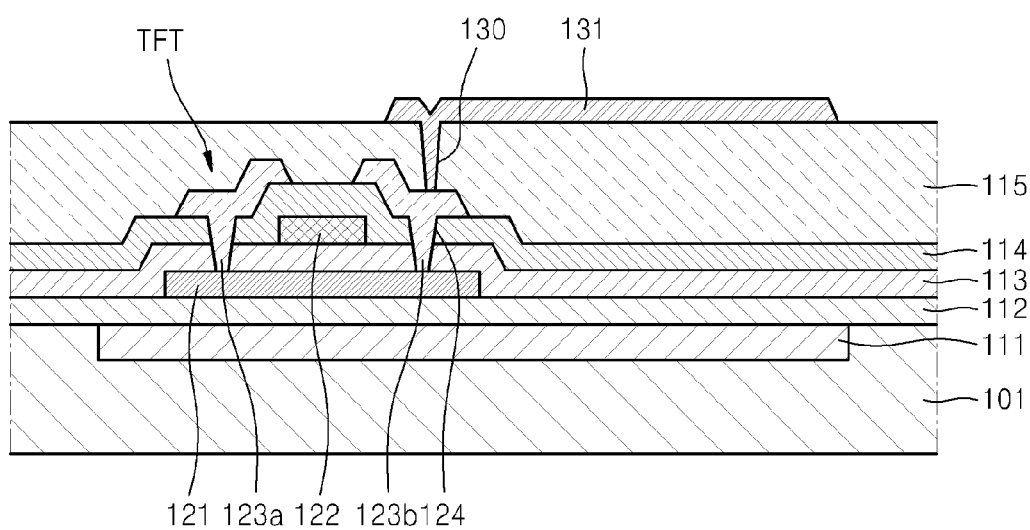

In order to form an OLED on the TFT, as illustrated in FIG. 5, a contact hole 130 is formed in one of the source and drain electrodes 123*a* and 123*b*, so that the one of the source and drain electrodes 123*a* and 123*b* may be electrically connected to a first electrode 131.

The first electrode 131 may function as one of electrodes to be arranged in the OLED, and may be formed of various conductive materials. In various embodiments, the first electrode 131 may be formed as a transparent electrode or a reflective electrode. In embodiments where the first electrode 131 is used as the transparent electrode, it may be formed of indium tin oxide (ITO), indium zinc oxide (IZO), zinc oxide (ZnO), indium oxide ($In_2O_3$) or the like. In embodiments where the first electrode 131 is used as the reflective electrode, the first electrode 131 may be formed in the same manner that a reflective layer is formed, by using a material selected from the group consisting of Ag, Mg, Al, Pt, Pd, Au, Ni, Nd, Ir, Cr, or any combinations thereof, and ITO, IZO, ZnO, or $In_2O_3$ may be formed thereon.

Figure 6:
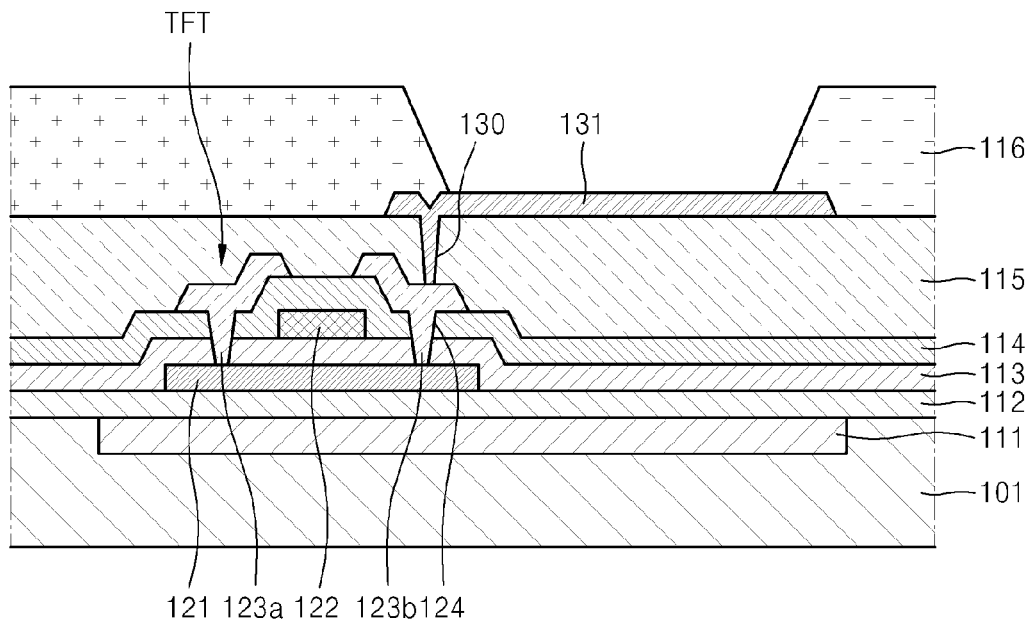
Figure 7:
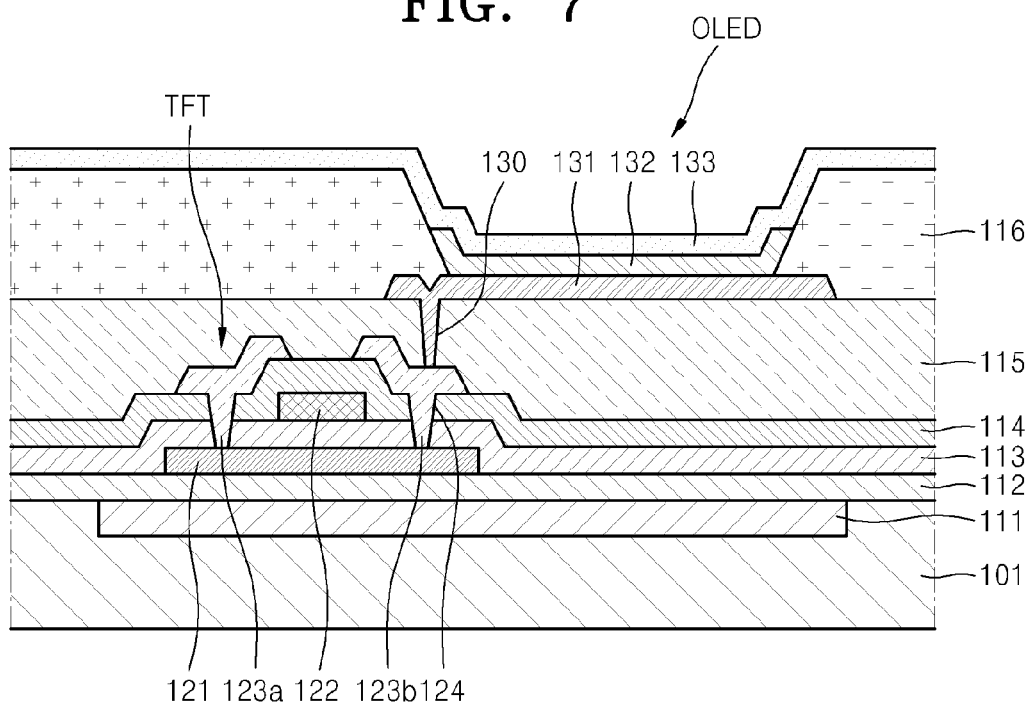

As illustrated in FIG. 6, a pixel defining layer (PDL) 116, patterned using an insulating material, is formed on the first electrode 131 such that at least a portion of the first electrode 131 is exposed. As illustrated in FIG. 7, an intermediate layer 132, including an emitting layer (not shown), is formed on the exposed portion of the first electrode 131. A second electrode 133 is formed to face the first electrode 131 with the intermediate layer 132 interposed therebetween, forming the OLED.

In the embodiment of FIG. 7, the intermediate layer 132 is patterned to correspond to only each subpixel, that is, the patterned first electrode 131. In other embodiments, the intermediate layer 132 may be integrally formed with the intermediate layer 132 of an adjacent subpixel. In some embodiments, some layers of the intermediate layer 132 may be formed for each subpixel, and other layers of the intermediate layer 132 may be integrally formed with the intermediate layer 132 of an adjacent subpixel.

In some embodiments, the intermediate layer 132 may be formed of a low-molecular organic material; in other embodiments, the intermediate layer may be formed of a polymer material. In embodiments using a low-molecular organic material, the intermediate layer 132 may be formed such that a hole injection layer (HIL), a hole transport layer (HTL), an emissive layer (EML), an electron transport layer (ETL), an electron injection layer (EIL) or the like may be stacked while having a single or composite structure (not shown). In such embodiments, the organic material used may include copper phthalocyanine (CuPc), N,N'-Di(naphthalene-1-yl)-N,N'-diphenyl-benzidine (NPB), tris-8-hydroxyquinoline aluminum (Alq3), or the like. In some embodiments, the low-molecular organic material may be formed by vacuum deposition using masks.

In embodiments using a polymer material, the intermediate layer 132 may have a structure including an HTL and an EML. In one embodiment, Polyethylenedioxythiophene (PEDOT) may be used as the HTL, and a Poly-Phenylenevinylene-based polymer material or a Polyfluorene-based polymer material may be used as the EML. The HTL and the EML may be formed using a screen printing process, an inkjet printing process, or the like.

The second electrode 133 may be formed as a transparent electrode or a reflective electrode. In embodiments where the second electrode 133 is used as the transparent electrode, the second electrode 133 may include an auxiliary electrode or a bus electrode line formed of a layer and a transparent electrode forming material formed on the layer. In such embodiments, the layer may be formed of a material selected from the group consisting of Li, Ca, LiF/Ca, LiF/Al, Al, Mg, or any combinations thereof, and the transparent electrode forming material includes ITO, IZO, ZnO, $In_2O_3$ or the like. In embodiments where the second electrode 133 is the reflective electrode, the second electrode 133 may be formed such that the material selected from the group consisting of Li, Ca, LiF/Ca, LiF/Al, Al, Mg, or any combinations thereof is entirely deposited.

The OLED is encapsulated. In order to encapsulate the OLED, a general thin film encapsulation method may be used.

Figure 8:
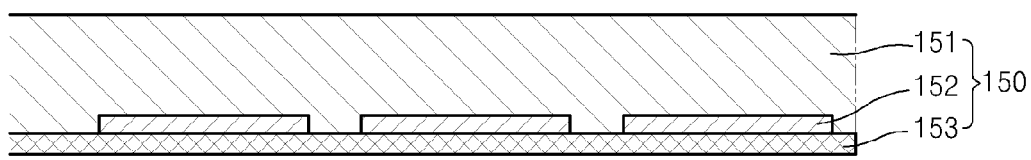

As illustrated in FIG. 8, an encapsulation member 150 may be separately arranged.

One embodiment of the method of manufacturing the flexible display device may involve separately manufacturing the encapsulation member 150, combining the encapsulation member 150 with an upper portion of the OLED, and separating a second substrate 151 of the encapsulation member 150.

According to the general thin film encapsulation method, an encapsulating process is directly performed on the OLED as a last process of an OLED manufacturing process. According to this method, a process temperature generally should not exceed 80° C. to prevent deterioration of the OLED. Additionally, plasma generally directly deteriorates the OLED when an organic film is deposited.

In order address these problems, embodiments of the method of manufacturing the flexible display device a are characterized by an encapsulation member including a substrate, a plastic film, and a barrier layer being separately formed, the encapsulation member being combined with the OLED, and the substrate being separated so that the encapsulating process with respect to the OLED is easily performed.

In one embodiment, in order to form the encapsulation member 150 of the flexible display device, a second plastic film 152 and a second barrier layer 153 are sequentially formed on the second substrate 151.

The second substrate 151 may have a plurality of depression units arranged, and the second plastic film 152 may be formed in the plurality of depression units of the second substrate 151. The second barrier layer 153 may be formed on the second plastic film 152 of the second substrate 151. Since formation of the second plastic film 152 in the plurality of depression units of the second substrate 151 is similar to the formation of the plastic film described in detail with reference to FIG. 2, a detailed description thereof will not be repeated.

The same glass substrate as the first substrate 101 may be used as the second substrate 151. In one embodiment, the second plastic film 152 may be formed of a plastic material that is lightweight compared to an existing glass substrate, that cannot be easily broken, and that is possible to implement having a curved surface. In one embodiment, the thickness of the second plastic film 152 may be between about 10 and about 100 μm. In one embodiment, the second plastic film 152 may be formed of polyimide or polycarbonate.

In some embodiments, the second barrier layer 153 may be formed of an inorganic material including SiOx, SiNx, SiON, AlO, AlON or the like. In other embodiments, the second barrier layer 153 may be formed of an organic material including acryl, polyimide or the like. In yet other embodiments, the second barrier layer 153 may be formed such that the organic material and the inorganic material are alternately stacked. The second barrier layer 153 functions to block oxygen and moisture, and to help crystallization of a semiconductor by preventing the diffusion of moisture or impurities generated in the second plastic film 152, or by adjusting a heat transfer speed when the crystallization is performed.

The second barrier layer 153 may be formed by performing a high temperature deposition process conducted at a temperature between about 80° C. and about 400° C. In this manner, the encapsulation member 150 is separately manufactured and is combined with the OLED, so that the encapsulation member 150 may include the second barrier layer 153 that may be formed in the high temperature deposition process. The encapsulation member 150 includes the second barrier layer 153, so that the OLED may be more stably protected.

Figure 9:
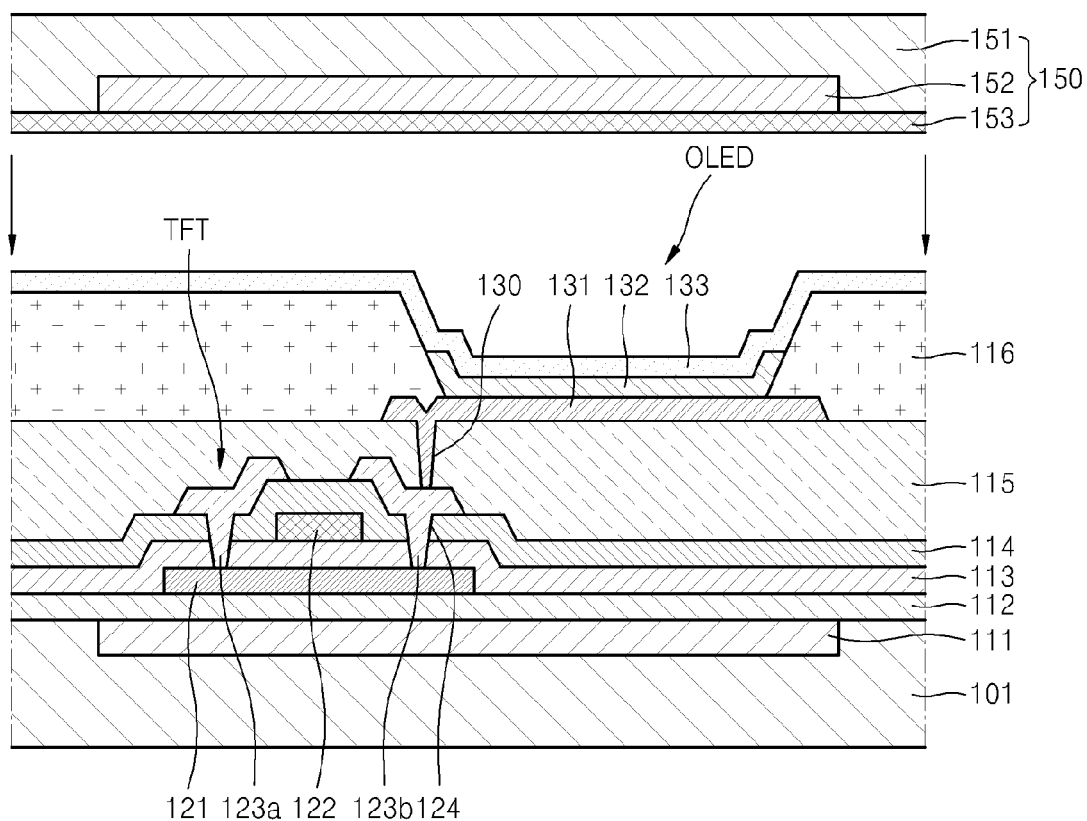

As illustrated in FIG. 9, with the encapsulation member 150 disposed above the OLED, the encapsulation member 150 and the OLED are bonded together. In some embodiments, in order to bond the encapsulation member 150 and the OLED, a laser beam (refer to L of FIG. 11) used in ablation of the first substrate 101 and the second substrate 151 may be used. In other embodiments, an adhesive material may be added in the second barrier layer 153, the encapsulation member 150 is disposed above the OLED, and the encapsulation member 150 and the OLED are bonded to each other.

Figure 10:
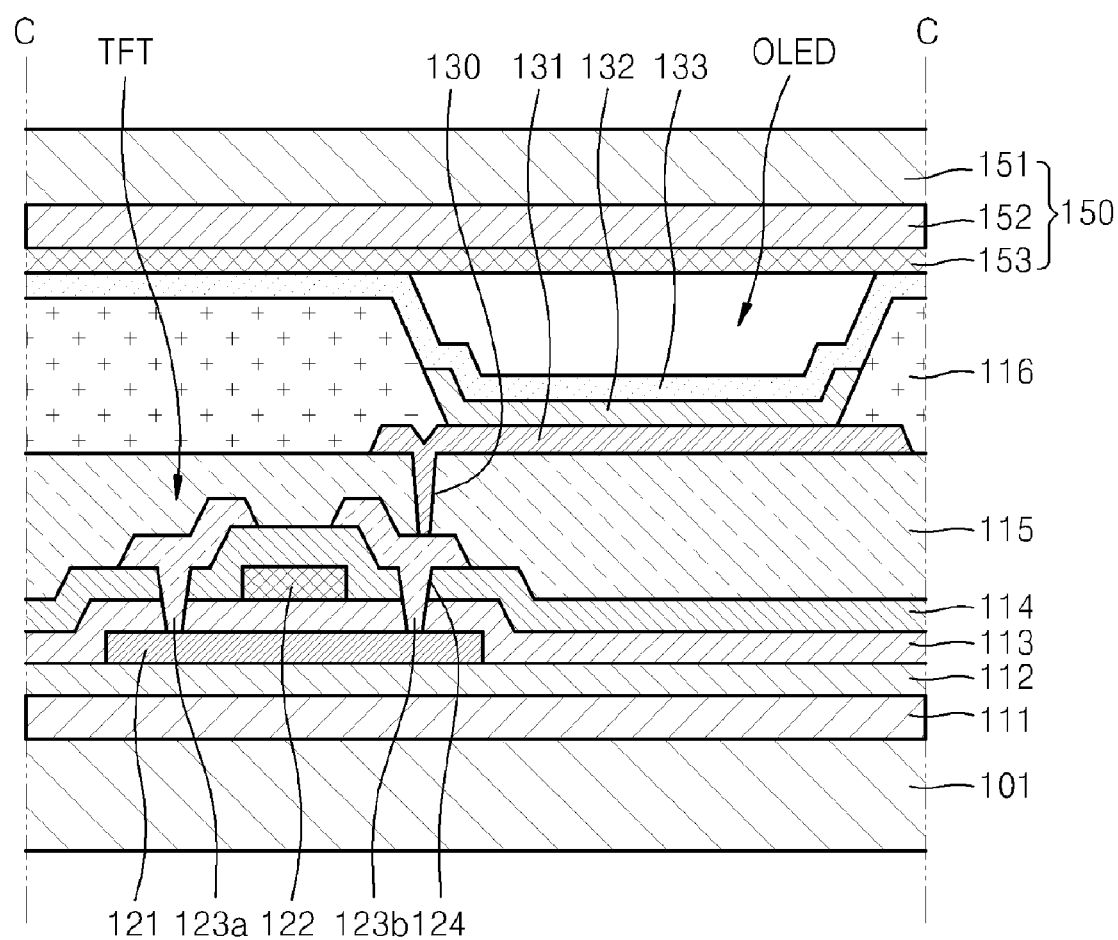

As illustrated in FIG. 10, a cutting process is performed for each panel. The cutting process is performed in a region of the first substrate 101 and the second substrate 151 where the plastic films 111 and 152 are not formed. With the depression unit 101a formed for each of panel regions in the first substrate 101, the plastic film, the TFT, and the display devices are formed in the depression unit 101a so that, when the cutting process is performed along an edge of the depression unit 101a, panels are divided in a manner that the first substrate 101 and the second substrate 151 are cut by using the diamond wheel.

Figure 11:
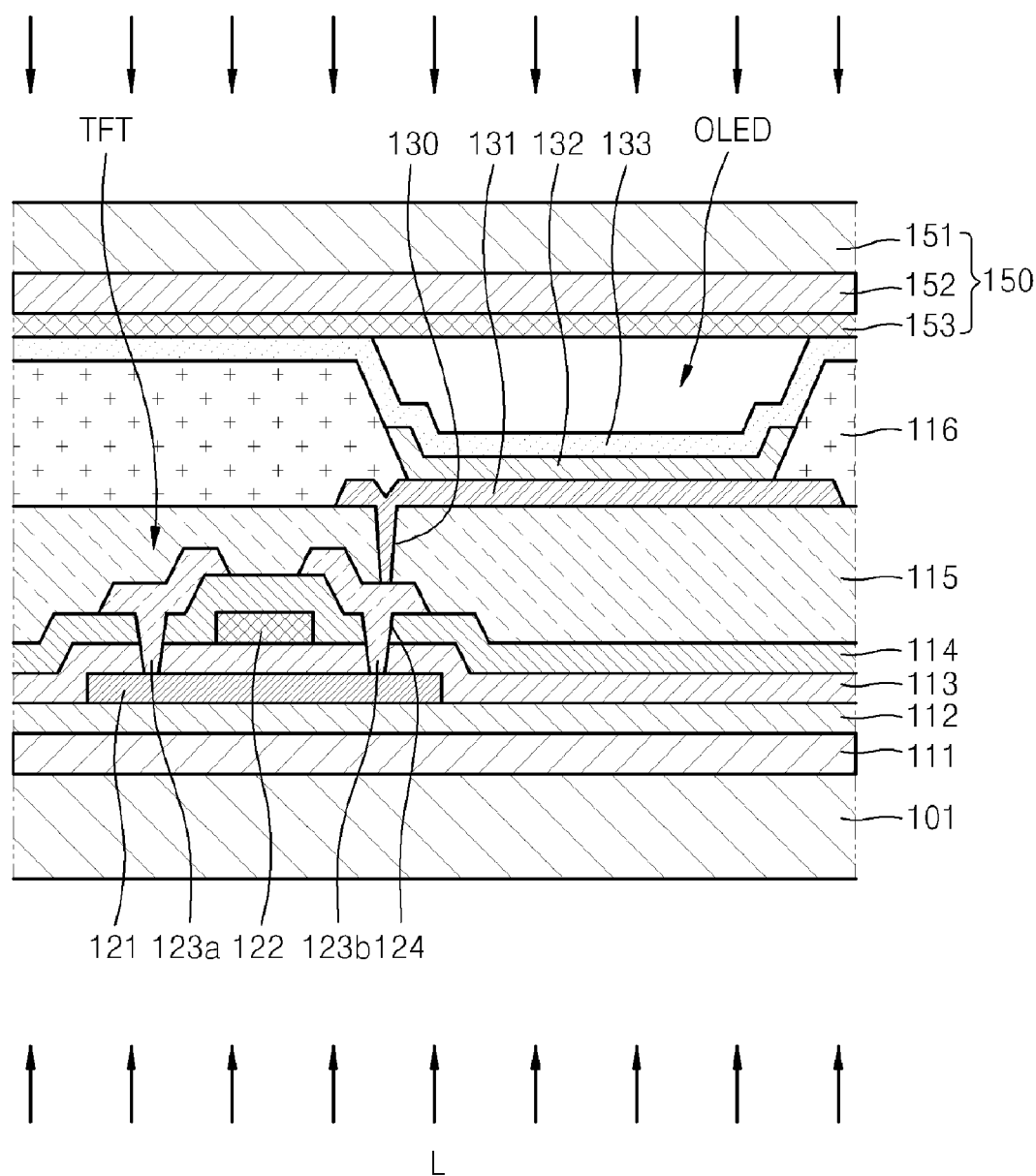
Figure 12:
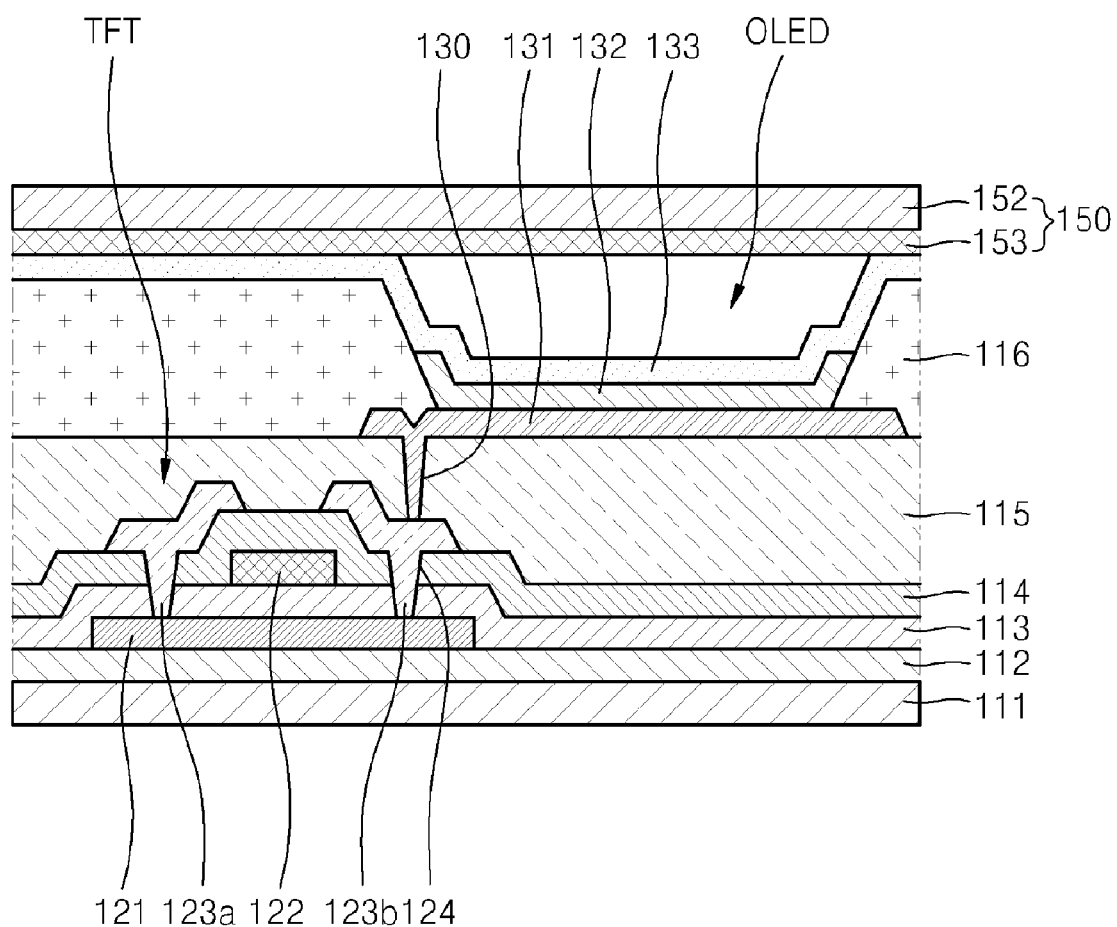

As illustrated in FIG. 11, the first substrate 101 and the second substrate 151 are separated by being irradiated with the laser beam L, and thus, as illustrated in FIG. 12, it is possible to obtain the flexible display device in which the TFT and the OLED are formed on the first plastic film 111. The laser beam L is irradiated to separate out the first substrate 101 and the second substrate 151. The laser beam L may be a light having an optical-coherence wavelength in the range of about 100 to about 350 nm. The laser beam L may include xenon chloride (XeCl), krypton fluoride (KrF), argon fluoride (ArF), or the like. There materials represent combinations of Ar, Kr and Xe, and a halogen gas (F2) and hydrogen chloride (HCl).

In the embodiment shown in FIG. 11, the laser beam L is irradiated so that the first substrate 101 and the second substrate 151 are separate. In other embodiments, since the first plastic film 111 and the second plastic film 152 are formed in units of panels, when the laser beam L is irradiated to the first plastic film 111 and the second plastic film 152, the first plastic film 111 and the second plastic film 152 are separated from the first substrate 101 and the second substrate 151, whereby each panel may be separated from the first substrate 101 and the second substrate 151 without performing separate cutting processes.

In some embodiments, the substrate may be cut for each panel by performing the cutting process once, so that a manufacturing process becomes simple and a production yield rate is increased. Furthermore, since the encapsulation process is not directly performed on the OLED, a possibility of the OLED deteriorating due to the plasma generated when the organic film is deposited, is reduced. It is possible to form the organic film on a plastic film that is resistant to high temperatures. Once the substrate is separated, the plastic film is exposed to the outside so that it is not necessary to provide a separate protective film. Embodiments make it possible to manufacture an organic light emitting display device that is thin, lightweight, and shock-resistant, and has a flexible characteristic suitable for implementation of a curved surface.

According to embodiments of the method of manufacturing the flexible display device, it is possible to relatively easily perform the cutting process on each panel of the display unit.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A method of manufacturing a flexible display device, the method comprising:
   arranging a first substrate having a plurality of depression units;
   forming a first plastic film in each of the plurality of depression units;
   forming a thin film transistor (TFT) on the first plastic film;
   forming a display device on the TFT, wherein the display device is configured to be electrically connected to the TFT;
   encapsulating an upper portion of the display device;
   cutting the first substrate; and
   separating the first substrate from the first plastic film.

2. The method of claim 1, wherein the cutting of the first substrate comprises cutting a region of the first substrate, wherein the plastic film is not formed on the region.

3. The method of claim 1, wherein the cutting of the first substrate comprises cutting the first substrate along an edge of each of the plurality of depression units.

4. The method of claim 1, wherein the cutting of the first substrate comprises cutting the first substrate along individual panels in a plurality of panels.

5. The method of claim 1, wherein a display panel is separately formed in each of the plurality of depression units.

6. The method of claim 1, wherein the forming of the first plastic film comprises:
   forming the first plastic film on the first substrate; and
   removing a portion of the first plastic film above a top portion of each of the plurality of depression units.

7. The method of claim 1, wherein the forming of the first plastic film comprises filling each of the plurality of depression units with the first plastic film by performing at least one of a nozzle printing process and an inkjet printing process.

8. The method of claim 1, wherein the separating of the first substrate is performed by irradiating a laser beam on the first substrate.

9. The method of claim 1, wherein the first plastic film comprises at least one of polyimide and polycarbonate.

10. The method of claim 1, wherein the encapsulating of the upper portion of the display device is conducted by performing a thin film encapsulation process.

11. The method of claim 1, wherein the encapsulating of the upper portion of the display device comprises:
   forming an encapsulation member, comprising
      arranging a second substrate having a plurality of second depression units;
      forming a second plastic film in each of the plurality of second depression units; and
   combining the encapsulation member with the upper portion of the display device.

12. The method of claim 11, wherein the encapsulation member is manufactured separately from the display device, and is combined with the display device.

13. The method of claim 11, wherein the forming of the encapsulation member comprises forming a second barrier layer on the second substrate and the second plastic film.

14. The method of claim 13, wherein the forming of the second barrier layer comprises performing a deposition process at a temperature between about 80° C. and about 400° C.

15. The method of claim 13, wherein the second barrier layer comprises a photocurable material, and the photocurable material is cured whereby the encapsulation member is combined with the upper portion of the display device.

16. The method of claim 13, wherein the second barrier layer comprises an adhesive material, and the encapsulation member is combined with the upper portion of the display device using the second barrier layer.

17. The method of claim 11, wherein the cutting of the first substrate further comprises simultaneously cutting the second substrate.

18. The method of claim 11, further comprising separating the second substrate from the second plastic film.

19. A method of manufacturing a flexible display device, the method comprising:
- arranging a first substrate having a plurality of depression units;
- forming a first plastic film in each of the plurality of depression units;
- forming a thin film transistor (TFT) on the first plastic film;
- forming a display device on the TFT, wherein the display device is configured to be electrically connected to the TFT;
- encapsulating an upper portion of the display device;
- irradiating a laser beam;
- separating the first plastic film, the TFT, and the display device from the first substrate in units of panels, wherein the TFT and the display device are formed on the plastic film.

20. The method of claim 19, wherein a display panel is separately formed in each of the plurality of depression units.

* * * * *